US008947156B2

(12) United States Patent
Stultz et al.

(10) Patent No.: US 8,947,156 B2
(45) Date of Patent: Feb. 3, 2015

(54) HIGH-VOLTAGE BULK DRIVER USING BYPASS CIRCUIT

(71) Applicant: Fairchild Semiconductor Corporation, San Jose, CA (US)

(72) Inventors: Julie Lynn Stultz, Scarborough, ME (US); Tyler Daigle, Portland, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/074,334

(22) Filed: Nov. 7, 2013

(65) Prior Publication Data

US 2014/0132311 A1    May 15, 2014

Related U.S. Application Data

(60) Provisional application No. 61/724,419, filed on Nov. 9, 2012.

(51) Int. Cl.
*H03K 3/01* (2006.01)
*H03K 3/012* (2006.01)

(52) U.S. Cl.
CPC ..................................... *H03K 3/012* (2013.01)
USPC ............ 327/534; 327/108; 327/333; 327/537

(58) Field of Classification Search
USPC ........... 327/108–112, 333, 534, 537, 99, 407, 327/408, 170, 427, 434, 437; 326/82, 83, 326/26; 307/130, 80, 81
See application file for complete search history.

(56) References Cited

U.S. PATENT DOCUMENTS

| | | | | |
|---|---|---|---|---|
| 3,178,584 A | * | 4/1965 | Clark | 327/222 |
| 3,225,311 A | * | 12/1965 | Ruhland | 331/113 A |
| 4,994,886 A | * | 2/1991 | Nadd | 257/368 |
| 6,509,781 B2 | * | 1/2003 | Dufort | 327/434 |
| 6,590,440 B1 | * | 7/2003 | Williams et al. | 327/396 |
| 6,670,790 B2 | * | 12/2003 | Stellberger | 320/134 |
| 7,215,043 B2 | * | 5/2007 | Tsai et al. | 307/130 |
| 7,430,137 B2 | * | 9/2008 | Greene et al. | 365/185.05 |
| 7,521,984 B2 | * | 4/2009 | Ricotti | 327/427 |
| 7,893,566 B2 | * | 2/2011 | Yarbrough et al. | 307/130 |

(Continued)

OTHER PUBLICATIONS

"Chinese Application Serial No. 201320709076.2, Notification to Make Rectification mailed Feb. 26, 2014", w/English Translation, 3 pgs.

(Continued)

*Primary Examiner* — Lincoln Donovan
*Assistant Examiner* — Thomas Skibinski
(74) *Attorney, Agent, or Firm* — Schwegman Lundberg & Woessner, P.A.

(57) ABSTRACT

This application discusses, among other things, apparatus and methods for driving the bulk of a high-voltage transistor using transistors having gates with low-voltage ratings. In an example, a bulk driver can include an output configured to couple to bulk of a high-voltage transistor, a pick circuit configured to couple the output to an input voltage at an input terminal of the high-voltage transistor or an output voltage at the output terminal of the high-voltage transistor when the high-voltage transistor is in a high impedance state, and a bypass circuit configured to couple the output of the bulk driver to the output voltage when the high-voltage transistor is in a low impedance state.

21 Claims, 2 Drawing Sheets

(56) References Cited

U.S. PATENT DOCUMENTS

| | | | |
|---|---|---|---|
| 7,924,085 B2 * | 4/2011 | Guo | 327/534 |
| 8,710,541 B2 * | 4/2014 | Aherne et al. | 257/121 |
| 2011/0235454 A1 * | 9/2011 | Huang et al. | 365/226 |

OTHER PUBLICATIONS

"Chinese Application Serial No. 201320709076.2, Response filed Apr. 22, 2014 to Office Action mailed Feb. 26, 2014", w/English Claims, 26 pgs.

* cited by examiner

HIGH-VOLTAGE BULK DRIVER USING BYPASS CIRCUIT

PRIORITY AND RELATED APPLICATIONS

This patent application claims the benefit of priority, under 35 U.S.C. Section 119(e), to Stultz et al., U.S. Provisional Patent Application Ser. No. 61/724,419, entitled "HIGH VOLTAGE BULK DRIVER," filed on Nov. 9, 2012, which is hereby incorporated by reference herein in its entirety.

BACKGROUND

Circuits for controlling high-voltage transistor switches need to be able to withstand high voltages in order to provide certain robust control circuits. As such, the control circuits of high-voltage transistors traditionally use high-voltage rated components that can be expensive to procure, use large device areas, and provide poor performance.

OVERVIEW

This application discusses, among other things, apparatus and methods for driving the bulk of a high-voltage transistor using transistors having gates with low-voltage ratings. In an example, a bulk driver can include an output configured to couple to bulk of a high-voltage transistor, a pick circuit configured to couple the output to an input voltage at an input terminal of the high-voltage transistor or an output voltage at the output terminal of the high-voltage transistor when the high-voltage transistor is in a high impedance state, and a bypass circuit configured to couple the output of the bulk driver to the output voltage when the high-voltage transistor is in a low impedance state.

This section is intended to provide an overview of subject matter of the present patent application. It is not intended to provide an exclusive or exhaustive explanation of the invention. The detailed description is included to provide further information about the present patent application

DETAILED DESCRIPTION

Certain examples of the present subject matter can allow devices with low voltage gates to be used to drive the bulk of high-voltage FETs. Some examples can minimize body effects when an FET is enabled. Bulk-source and bulk-drain diodes can be reverse biased when the FET is disabled.

Figure 1:
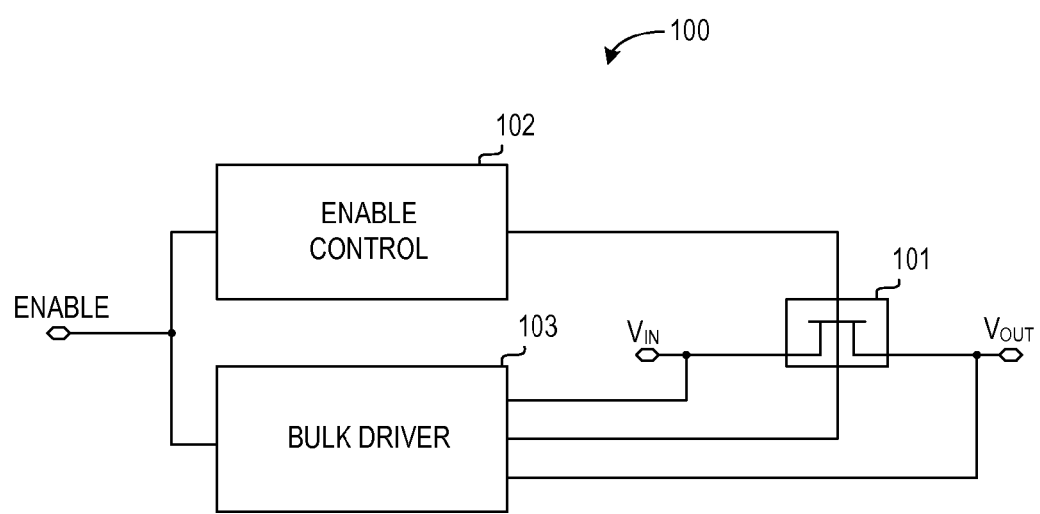
FIG. 1 illustrates generally a high-voltage transistor pass gate system including an example bulk driver.

FIG. 1 illustrates generally a high-voltage transistor pass gate system 100 including an example bulk driver. In certain examples, the high-voltage transistor pass gate system 100 can include a high-voltage transistor 101, enable control logic 102 and a bulk driver 103. The enable control logic 102 responds to an enable signal (ENABLE) to switch the high-voltage transistor 101 between a high impedance state and a low impedance state using an output coupled to the gate of the high-voltage transistor 101. In certain examples, the high impedance state isolates the input terminal of the high-voltage transistor 101 from the output terminal of the high-voltage transistor. In some examples, the enable control logic 102 can include additional inputs including, but not limited to, supply voltage inputs, an input for receiving the input voltage ($V_{IN}$) at the input terminal of the high-voltage transistor 101, an input for receiving the output voltage ($V_{OUT}$) at the output terminal of the high-voltage transistor 101, or combinations thereof.

In certain examples, the bulk driver 103 can couple the bulk of the high-voltage transistor to a voltage that improves performance of the high-voltage transistor. In some examples, devices with low voltage gates can be used to drive the bulk of the high-voltage transistor 101 to minimize body diode effects of the high-voltage transistors 101 such as minimizing the body effect when the high-voltage transistor 101 is enabled, or in a low impedance state, and maintaining the bulk source diodes and the bulk drain diodes of the high-voltage transistor 101 in reverse bias when the high-voltage transistor 101 is disabled or in the high impedance state. In some examples, the bulk driver 103 can include additional inputs including, but not limited to, supply voltage inputs.

Figure 2:
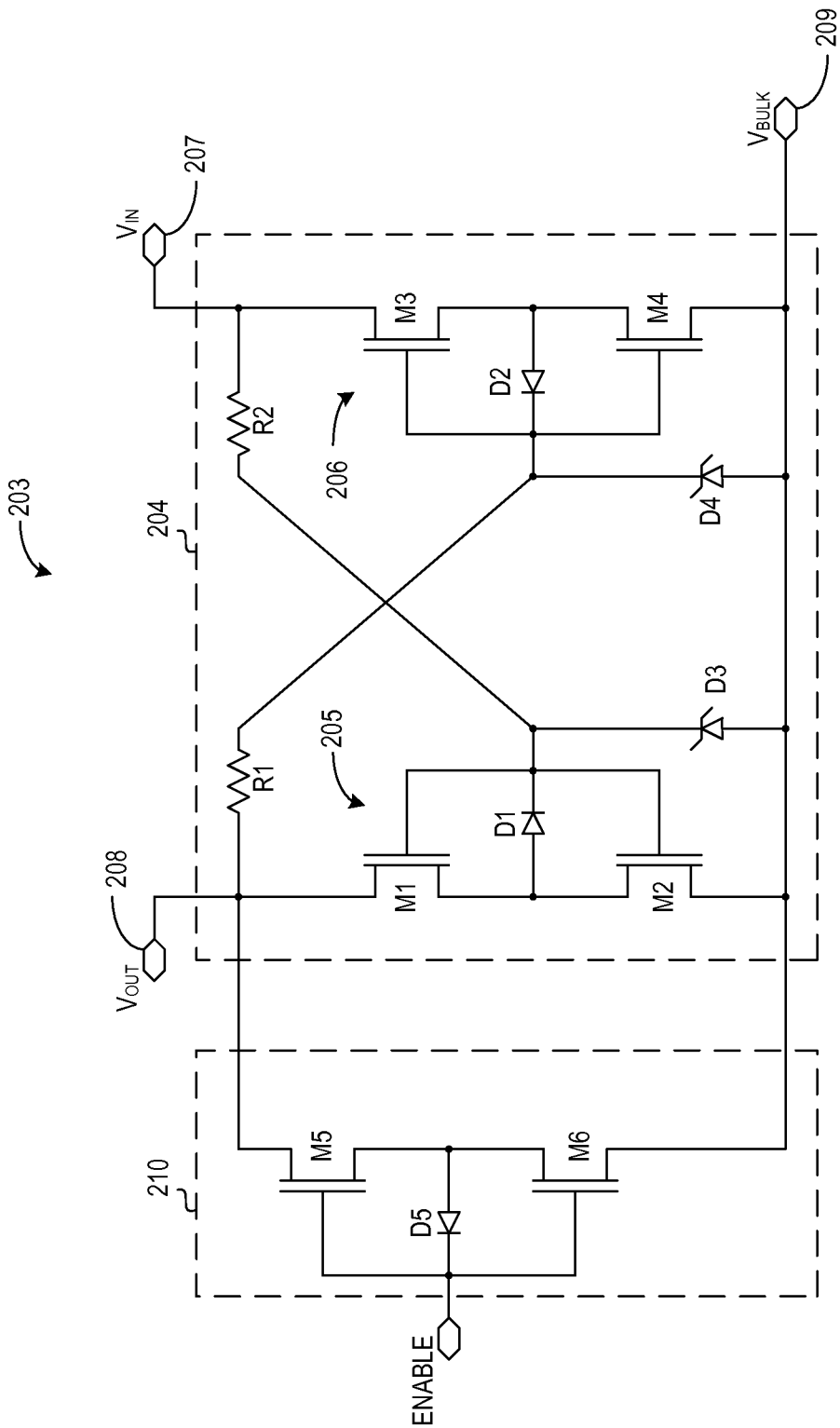
FIG. 2 illustrates generally an example bulk driver for a high-voltage transistor switch.

FIG. 2 illustrates generally an example bulk driver 203 for a high-voltage transistor switch (not shown). In certain examples the bulk driver 203 can include a cross coupled circuit sometimes referred to as a pick circuit 204. In some examples, the pick circuit 204 can apply one of two voltage levels ($V_{IN}$, $V_{OUT}$) to the bulk of a high-voltage transistor such as a high-voltage pass gate transistor or a high-voltage FET when the pass gate transistor is off, or in a high impedance state In certain examples, the pick circuit 204 can include a first transistor switch 205 cross coupled to a second transistor switch 206 to provide an output voltage ($V_{BULK}$) for coupling to the bulk of the high-voltage pass gate transistor. In some examples, each transistor switch 205, 206 can include two laterally diffused transistors (M1 and M2, M3 and M4) that can include a low voltage gate and can accommodate high voltage on the drain node of each laterally diffused transistor (M1, M2, M3, M4). Laterally diffused transistors are relatively small and less costly to use than high-voltage transistors having high gate-to-source voltage ($V_{GS}$) ratings and can provide improved performance. First and second inputs 207, 208 of the pick circuit 204 can couple to voltages ($V_{IN}$, $V_{OUT}$) at the switched terminals of the high-voltage pass gate transistor. An output 209 of the pick circuit 204 can couple to the bulk of the pass gate transistor. The example bulk driver 203 of FIG. 2 includes NMOS type transistors. The pick circuit 204 can receive the voltages ($V_{IN}$, $V_{OUT}$) on each switched terminal of the high-voltage pass gate transistor and can provide the lower of the two voltages ($V_{BULK}$) to the output 209 for coupling to the bulk of the high-voltage pass gate transistor. In certain examples, driving the bulk of a pass gate to the most negative voltage ($V_{IN}$ or $V_{OUT}$) can keep the source-bulk and drain-bulk diodes reverse bias when the pass gate is disabled (e.g., "off" or in the high impedance state). In certain examples, the cross coupled circuit can include PMOS devices and can be configured to couple the bulk of the pass gate to the higher of the two received voltages. In certain examples, each transistor switch 205, 206 of the pick circuit 204 can include two laterally diffused transistors coupled in series and a diode (D1, D2) coupled between the gates of the laterally diffused transistors and the common node between the laterally diffused transistors. The diode configuration between the laterally diffused transistors can allow high voltage across the transistor switch 205, 206 to be properly distributed across the drain-source junctions of each laterally diffused transistor while also protecting the low voltage nature of the gate junctions. In some examples, diodes D1 and D2 can clamp the common sources, or common source node, of the lateral diffused transistor pairs (M1-M2 and M3-M4)

when the lateral diffused transistors (M1, M2, M3, M4) are disabled to prevent the common source node from charging through coupling to a high voltage beyond the $V_{GS}$ rating of the low-voltage gate-source junction of the laterally diffused transistors (M1, M2, M3, M4). In certain examples, the pick circuit 204 can include a zener diode (D3, D4) coupled between the output 209 and the gate of each pair of the laterally diffused transistors (M1 and M2, M3 and M4) of each transistor switch 205, 206. The zener diode (D3, D4) can clamp the gate voltage to protect the gate oxide of each laterally diffused transistor (M1, M2, M3, M4) from over voltage stress. In certain examples, the pick circuit 204 can include a current limit resistor (R1, R2) associated with each of the cross couplings.

In certain examples, the bulk driver 203 can include bypass switch 210. In some examples, the bypass switch 210 can couple the output 209 of the bulk driver 210 to a third voltage level when the high-voltage pass gate transistor is enabled (e.g., "on" or in a low impedance state). In certain examples, the third voltage can be one of either the input voltage ($V_{IN}$) or the output voltage ($V_{OUT}$) associated with the high-voltage pass gate transistor. In certain examples, the bypass circuit 210 can be used to assure that the bulk of the high-voltage pass gate transistor is driven through a low impedance path. For example, without a bypass circuit 210, the bulk can be driven by the cross coupled circuit alone. However, if there is not a substantial potential difference between the input and output voltages ($V_{IN}$, $V_{OUT}$), there will not be a gate potential available to turn on either of the cross-coupled transistor switches 205, 206. Thus, the bulk can be left floating. In certain examples, the bypass switch 210 can include a pair of laterally diffused transistors (M5, M6) coupled between the third voltage and the output 209. In certain examples, the gates of the laterally diffused transistors (M5, M6) of the bypass switch can be coupled to the enable signal (ENABLE) of the pass gate or a representation of the enable signal of the pass gate. In certain examples, a diode (D5) can clamp the common source node of the pair of laterally diffused transistors (M5-M6) when the laterally diffused transistors (M5, M6) of the bypass switch 210 are disabled so as to prevent the common source node from charging through coupling to a high voltage beyond the $V_{GS}$ rating of each laterally diffused transistor (M5, M6).

An advantage of the example bulk driver is that the laterally diffused transistors can allow the circuit to switch high voltages using certain high-voltage structures while using low voltage structures in other areas of the circuit. Herein, high voltage can include voltages that can over stress traditional CMOS gates. In certain examples, where low voltage components are rated to operate at a maximum of about 2.5 volts, high voltages can include voltages above about 2.5 volts. In certain examples, where low voltage devices are rated to operate at a maximum of about 5 volts, high voltages can include voltages above about 5 volts, etc. In certain examples, high voltage devices are rated to operate with a drain source voltages of more than 60 volts.

ADDITIONAL NOTES

In Example 1, a bulk driver for a high-voltage transistor, can include an output configured to couple to the bulk of the high-voltage transistor, a pick circuit configured to couple the bulk of the high-voltage transistor to an input voltage at the input terminal or an output voltage at the output terminal when the pass gate switch is in the high impedance state, and a bypass circuit configured to couple the output of the bulk driver to the output voltage when the high-voltage transistor is in the low impedance state. The high-voltage transistor can couple an input terminal with an output terminal in a low-impedance state and can isolate the input terminal from the output terminal in a high impedance state.

In Example 2, the pick circuit of Example 1 optionally includes a first transistor switch, the first transistor switch including a gate node and first and second switch node, wherein the first transistor switch is configured to receive the input voltage at the first switch node of the first transistor switch, a second transistor switch, the second transistor switch including a gate node and first and second switch nodes, wherein the second transistor switch is configured to receive the output voltage at the first switch node of the second transistor switch, a first current limit resistor configured to couple the first switch node of the first transistor switch to the gate node of the second transistor switch, and a second current limit transistor configured to couple the first switch node of the second transistor switch to the gate node of the first transistor switch.

In Example 3, the pick circuit of any one or more of Examples 1-2 optionally includes a first zener diode having an cathode coupled to the gate node of the first transistor switch and an anode coupled to the second switch node of the first transistor switch.

In Example 4, the pick circuit of any one or more of Examples 1-3 optionally includes a second zener diode having an cathode coupled to the gate node of the second transistor switch and an anode coupled to the second switch node of the second transistor switch.

In Example 5, the first transistor switch of any one or more of Examples 1-4 optionally includes a first lateral diffused transistor and a second lateral diffused transistor coupled in series, wherein a gate of the first lateral transistor of the first transistor switch and a gate of the second lateral transistor of the first transistor switch are coupled together at the gate node of the first transistor switch.

In Example 6, the second transistor switch of any one or more of Examples 1-5 optionally includes a first lateral diffused transistor and a second lateral diffused transistor coupled in series, wherein a gate of the first lateral transistor of the second transistor switch and a gate of the second lateral transistor of the second transistor switch are coupled together at the gate node of the second transistor switch.

In Example 7, the bypass circuit of any one or more of Examples 1-6 optionally includes a first lateral diffused transistor and a second lateral diffused transistor coupled in series, the first lateral diffused transistor configured to couple to a switch node of the high-voltage transistor and the second lateral diffused transistor is configured to couple to the bulk of high-voltage transistor using the output of the bulk driver.

In Example 8, a method of driving bulk of a high-voltage field effect transistor (FET), the high-voltage FET configured to couple an input terminal with an output terminal in a low-impedance state and to isolate the input terminal from the output terminal in a high impedance state, the method can include receiving an low-voltage enable signal at a bulk driver circuit, the low voltage enable signal configured to establish the high-voltage FET in the low impedance state, receiving the low voltage enable signal at a gate node of a bypass circuit, and coupling the output terminal of the high-voltage FET to the bulk of the high-voltage FET using first and second lateral diffused transistors of the bypass circuit coupled in series between the output node and the bulk of the high-voltage FET.

In Example 9, the method of any one or more of Examples 1-8 optionally includes receiving an output voltage from the output terminal of the high-voltage FET at a first input of a pick circuit, receiving an input voltage from the input terminal of the high-voltage FET at a second input of a pick circuit, and when the output voltage is lower than the input voltage, coupling the output voltage to the bulk of the high-voltage FET using a first pair of lateral diffused transistors coupled in series between the output terminal of the high-voltage FET and the bulk of the high-voltage FET, wherein the first pair of lateral diffused transistors are cross coupled to a second pair of a second pair of lateral diffused transistors, the second pair of lateral diffused transistors coupled in series between the input terminal of the high-voltage FET and the bulk of the high-voltage FET.

In Example 10, the method of any one or more of Examples 1-9 optionally includes when the input voltage is lower than the output voltage, coupling the input voltage to the bulk of the high-voltage FET using a second pair of lateral diffused transistors coupled in series between the input terminal of the high-voltage FET and the bulk of the high-voltage FET.

In Example 11, the method of any one or more of Examples 1-10 optionally includes clamping a first voltage at a gate node of the first pair of lateral diffused transistors to prevent gate oxide stress of the first pair of lateral diffused transistors using a first zener diode coupled between the gate node of first pair of lateral diffused transistors and the bulk of the high-voltage FET.

In Example 12, the clamping a first voltage of any one or more of Examples 1-11 optionally includes limiting a first current of a first cross coupled connection between the first pair of lateral diffused transistors and the second pair of lateral diffused transistors using a first current limit resistor.

In Example 13, the method of any one or more of Examples 1-12 optionally includes clamping a second voltage at a gate node of the second pair of lateral diffused transistors to prevent gate oxide stress of the second pair of lateral diffused transistors using a second zener diode coupled between the gate node of second pair of lateral diffused transistors and the bulk of the high-voltage FET.

In Example 14, the clamping a second voltage of any one or more of Examples 1-13 optionally includes limiting a second current of a second cross coupled connection between the first pair of lateral diffused transistors and the second pair of lateral diffused transistors using a second current limit resistor.

In Example 15, a high-voltage transistor switch system can include a high-voltage field effect transistor configured to couple an input terminal with an output terminal in a low-impedance state and to isolate the input terminal from the output terminal in a high impedance state, and a bulk driver configured to drive a bulk of the high-voltage field effect transistor. The bulk driver can include an output configured to couple to the bulk of the high-voltage transistor, a pick circuit configured to couple a bulk of the high-voltage transistor to an input voltage at the input terminal or an output voltage at the output terminal when the pass gate switch is in the high impedance state, and a bypass circuit configured to couple the output of the bulk driver to the output voltage when the high-voltage transistor is in the low impedance state.

In Example 16, the pick circuit of any one or more of Examples 1-15 optionally includes a first transistor switch, the first transistor switch including a gate node and first and second switch node, wherein the first transistor switch is configured to receive the input voltage at the first switch node of the first transistor switch, a second transistor switch, the second transistor switch including a gate node and first and second switch nodes, wherein the second transistor switch is configured to receive the output voltage at the first switch node of the second transistor switch, a first current limit resistor configured to couple the first switch node of the first transistor switch to the gate node of the second transistor switch, and a second current limit transistor configured to couple the first switch node of the second transistor switch to the gate node of the first transistor switch.

In Example 17, the pick circuit of any one or more of Examples 1-16 optionally includes a first zener diode having an cathode coupled to the gate node of the first transistor switch and an anode coupled to the second switch node of the first transistor switch.

In Example 18, the pick circuit of any one or more of Examples 1-17 optionally includes a second zener diode having an cathode coupled to the gate node of the second transistor switch and an anode coupled to the second switch node of the second transistor switch.

In Example 19, the first transistor switch of any one or more of Examples 1-18 optionally includes a first lateral diffused transistor and a second lateral diffused transistor coupled in series, wherein a gate of the first lateral transistor of the first transistor switch and a gate of the second lateral transistor of the first transistor switch are coupled together at the gate node of the first transistor switch.

In Example 20, the second transistor switch of any one or more of Examples 1-19 optionally includes a first lateral diffused transistor and a second lateral diffused transistor coupled in series, wherein a gate of the first lateral transistor of the second transistor switch and a gate of the second lateral transistor of the second transistor switch are coupled together at the gate node of the second transistor switch.

In Example 21, the bypass circuit of any one or more of Examples 1-13 optionally includes a first lateral diffused transistor and a second lateral diffused transistor coupled in series, the first lateral diffused transistor configured to couple to a switch node of the high-voltage transistor and the second lateral diffused transistor is configured to couple to the bulk of high-voltage transistor using the output of the bulk driver.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A bulk driver for a high-voltage transistor, the high-voltage transistor configured to couple an input terminal with an output terminal in a low-impedance state and to isolate the input terminal from the output terminal in a high impedance state, the bulk driver comprising:
   an output configured to couple to a bulk of the high-voltage transistor;
   a pick circuit configured to couple the bulk of the high-voltage transistor to an input voltage at the input terminal or an output voltage at the output terminal when the high-voltage transistor is in the high impedance state; and
   a bypass circuit configured to couple the output of the bulk driver to the output voltage when the high-voltage transistor is in the low impedance state.

2. The bulk driver of claim 1, wherein the pick circuit includes:

a first transistor switch, the first transistor switch including a gate node and first and second switch node, wherein the first transistor switch is configured to receive the input voltage at the first switch node of the first transistor switch;
a second transistor switch, the second transistor switch including a gate node and first and second switch nodes, wherein the second transistor switch is configured to receive the output voltage at the first switch node of the second transistor switch;
a first current limit resistor configured to couple the first switch node of the first transistor switch to the gate node of the second transistor switch; and
a second current limit resistor configured to couple the first switch node of the second transistor switch to the gate node of the first transistor switch.

3. The bulk driver of claim 2, wherein the pick circuit includes a first zener diode having an cathode coupled to the gate node of the first transistor switch and an anode coupled to the second switch node of the first transistor switch.

4. The bulk driver of claim 3, wherein the pick circuit includes a second zener diode having an cathode coupled to the gate node of the second transistor switch and an anode coupled to the second switch node of the second transistor switch.

5. The bulk driver of claim 2, wherein the first transistor switch includes a first lateral diffused transistor and a second lateral diffused transistor coupled in series, wherein a gate of the first lateral transistor of the first transistor switch and a gate of the second lateral transistor of the first transistor switch are coupled together at the gate node of the first transistor switch.

6. The bulk driver of claim 2, wherein the second transistor switch includes a first lateral diffused transistor and a second lateral diffused transistor coupled in series, wherein a gate of the first lateral transistor of the second transistor switch and a gate of the second lateral transistor of the second transistor switch are coupled together at the gate node of the second transistor switch.

7. The bulk driver of claim 1, wherein the bypass circuit includes a first lateral diffused transistor and a second lateral diffused transistor coupled in series, the first lateral diffused transistor configured to couple to a switch node of the high-voltage transistor and the second lateral diffused transistor is configured to couple to the bulk of high-voltage transistor using the output of the bulk driver.

8. A method of driving bulk of a high-voltage field effect transistor (FET), the high-voltage FET configured to couple an input terminal with an output terminal in a low-impedance state and to isolate the input terminal from the output terminal in a high impedance state, the method comprising:
   receiving an low-voltage enable signal at a bulk driver circuit, the low voltage enable signal configured to establish the high-voltage FET in the low impedance state;
   receiving the low voltage enable signal at a gate node of a bypass circuit; and
   coupling the output terminal of the high-voltage FET to a bulk of the high-voltage FET using first and second lateral diffused transistors of the bypass circuit coupled in series between the output node and the bulk of the high-voltage FET.

9. The method of claim 8, including
receiving an output voltage from the output terminal of the high-voltage FET at a first input of a pick circuit;

receiving an input voltage from the input terminal of the high-voltage FET at a second input of the pick circuit; and when the output voltage is lower than the input voltage, coupling the output voltage to the bulk of the high-voltage FET using a first pair of lateral diffused transistors coupled in series between the output terminal of the high-voltage FET and the bulk of the high-voltage FET, wherein the first pair of lateral diffused transistors are cross coupled to a second pair of lateral diffused transistors, the second pair of lateral diffused transistors coupled in series between the input terminal of the high-voltage FET and the bulk of the high-voltage FET.

10. The method of claim 9, including, when the input voltage is lower than the output voltage, coupling the input voltage to the bulk of the high-voltage FET using the second pair of lateral diffused transistors coupled in series between the input terminal of the high-voltage FET and the bulk of the high-voltage FET.

11. The method of claim 9, including clamping a first voltage at a gate node of the first pair of lateral diffused transistors to prevent gate oxide stress of the first pair of lateral diffused transistors using a first zener diode coupled between the gate node of first pair of lateral diffused transistors and the bulk of the high-voltage FET.

12. The method of claim 11, wherein the clamping a first voltage includes limiting a first current of a first cross coupled connection between the first pair of lateral diffused transistors and the second pair of lateral diffused transistors using a first current limit resistor.

13. The method of claim 12, including clamping a second voltage at a gate node of the second pair of lateral diffused transistors to prevent gate oxide stress of the second pair of lateral diffused transistors using a second zener diode coupled between the gate node of second pair of lateral diffused transistors and the bulk of the high-voltage FET.

14. The method of claim 13, wherein the clamping a second voltage includes limiting a second current of a second cross coupled connection between the first pair of lateral diffused transistors and the second pair of lateral diffused transistors using a second current limit resistor.

15. A high-voltage transistor switch system comprising
A high-voltage field effect transistor configured to couple an input terminal with an output terminal in a low-impedance state and to isolate the input terminal from the output terminal in a high impedance state; and
a bulk driver configured to drive a bulk of the high-voltage field effect transistor, the bulk driver comprising:
an output configured to couple to the bulk of the high-voltage transistor;
a pick circuit configured to couple the bulk of the high-voltage transistor to an input voltage at the input terminal or an output voltage at the output terminal when the high-voltage transistor is in the high impedance state; and a bypass circuit configured to couple the output of the bulk driver to the output voltage when the high-voltage transistor is in the low impedance state.

16. The high-voltage transistor switch system of claim 15, wherein the pick circuit includes:
a first transistor switch, the first transistor switch including a gate node and first and second switch node, wherein the first transistor switch is configured to receive the input voltage at the first switch node of the first transistor switch;
a second transistor switch, the second transistor switch including a gate node and first and second switch nodes, wherein the second transistor switch is configured to receive the output voltage at the first switch node of the second transistor switch;
a first current limit resistor configured to couple the first switch node of the first transistor switch to the gate node of the second transistor switch; and
a second current limit resistor configured to couple the first switch node of the second transistor switch to the gate node of the first transistor switch.

17. The high-voltage transistor switch system of claim 15, wherein the pick circuit includes a first zener diode having an cathode coupled to the gate node of the first transistor switch and an anode coupled to the second switch node of the first transistor switch.

18. The high-voltage transistor switch system of claim 17, wherein the pick circuit includes a second zener diode having an cathode coupled to the gate node of the second transistor switch and an anode coupled to the second switch node of the second transistor switch.

19. The high-voltage transistor switch system of claim 15, wherein the first transistor switch includes a first lateral diffused transistor and a second lateral diffused transistor coupled in series, wherein a gate of the first lateral transistor of the first transistor switch and a gate of the second lateral transistor of the first transistor switch are coupled together at the gate node of the first transistor switch.

20. The high-voltage transistor switch system of claim 15, wherein the second transistor switch includes a first lateral diffused transistor and a second lateral diffused transistor coupled in series, wherein a gate of the first lateral transistor of the second transistor switch and a gate of the second lateral transistor of the second transistor switch are coupled together at the gate node of the second transistor switch.

21. The high-voltage transistor switch system of claim 15, wherein the bypass circuit includes a first lateral diffused transistor and a second lateral diffused transistor coupled in series, the first lateral diffused transistor configured to couple to a switch node of the high-voltage transistor and the second lateral diffused transistor is configured to couple to the bulk of the high-voltage transistor using the output of the bulk driver.

* * * * *

UNITED STATES PATENT AND TRADEMARK OFFICE
CERTIFICATE OF CORRECTION

| | | |
|---|---|---|
| PATENT NO. | : 8,947,156 B2 | |
| APPLICATION NO. | : 14/074334 | |
| DATED | : February 3, 2015 | |
| INVENTOR(S) | : Stultz et al. | |

It is certified that error appears in the above-identified patent and that said Letters Patent is hereby corrected as shown below:

In the Claims

In column 10, line 22, in Claim 17, delete "15," and insert --16,--, therefor

In column 10, line 32, in Claim 19, delete "15," and insert --16,--, therefor

In column 10, line 39, in Claim 20, delete "15," and insert --16,--, therefor

Signed and Sealed this
Fifteenth Day of September, 2015

Michelle K. Lee
*Director of the United States Patent and Trademark Office*